United States Patent [19]
Setsune et al.

[11] Patent Number: 5,527,767
[45] Date of Patent: Jun. 18, 1996

[54] METHOD FOR ANNEALING THIN FILM SUPERCONDUCTORS

[75] Inventors: Kentaro Setsune, Sakai; Kiyotaka Wasa, Nara; You Ichikawa, Moriguchi, all of Japan

[73] Assignee: Matsushita Electric Industrial Co., Ltd., Osaka-fu, Japan

[21] Appl. No.: 238,339

[22] Filed: May 5, 1994

Related U.S. Application Data

[63] Continuation of Ser. No. 32,165, Mar. 19, 1993, abandoned, which is a continuation of Ser. No. 730,523, Jul. 12, 1991, abandoned, which is a continuation-in-part of Ser. No. 507,117, Apr. 19, 1990, abandoned.

[30] Foreign Application Priority Data

Apr. 11, 1989 [JP] Japan ..................................... 1-91338
Apr. 11, 1989 [JP] Japan ..................................... 1-91347

[51] Int. Cl.$^6$ ............................. H01L 39/24; B05D 3/06
[52] U.S. Cl. ........................ 505/480; 505/500; 505/501; 505/238; 505/451; 505/729; 505/742; 427/62; 427/553; 427/554; 427/559
[58] Field of Search ................................. 505/500, 501, 505/480, 742, 238, 473, 729; 427/62, 63, 553, 554, 559

[56] References Cited

FOREIGN PATENT DOCUMENTS

| | | |
|---|---|---|
| 61-48527 | 3/1986 | Japan. |
| 63-241824 | 10/1988 | Japan. |
| 01-73776 | 3/1989 | Japan. |
| 01-115899 | 5/1989 | Japan. |
| 01-306089 | 12/1989 | Japan. |

OTHER PUBLICATIONS

Matsushima et al, "Structure and Superconducting Properties of Bi—Sr—Ca—Cu—O Thin Films Annealed at Low Temperatures", Jpn. J. Appl. Phys. 28(1) Jan. 1989 pp. L97–L99.

Aizaki et al, "$YBa_2Cu_3O_y$ superconducting thin film obtained by laser annealing", Jpn. J. Appl. Phys. 27(2) Feb. 1988 pp. L231–233.

JP 1-220874 (A) T. Matsumoto, published on Sep. 4, 1989 "Treatment of oxide superconductor thin film".

JP 1-220875 (A) T. Matsumoto, published on Sep. 4, 1989 "Treatment of oxide superconductor thin film".

JP 1-220876 (A) H. Tsuge, published on Sep. 4, 1989 "Writing of oxide superconductor film".

Applied Physics A, Solids and Surfaces, vol. 46, Aug. 1988, pp. 331–334, Berlin, DE; G. Liberts et al.: "Direct laser writing of superconducting patterns into semiconducting Y–Ba–Cu–O" *p. 331, paragraph 2; p. 333, pargraphs 5–6*.

Japanese Journal Of Applied Physics, vol. 26, No. 10, Oct. 1987, p. L1731–L1733, Tokyo, JP; K. Murakami et al.: "Energy beam irradiation of of high–Tc superconductors $YlBa2Cu307$-y and $H01Ba2Cu307$-y" *p. L1731, paragraphs 1–3*.

Extended Abstracts of the 20th Conference on Solid State Devices and Materials, Aug. 1988, pp. 435–438, Tokyo, JP; Y. Yonezawa et al.: "Preparation of high Tc oxide superconducting films by laser annealing" *p. 435, full page; p. 437, right–hand column; p. 438, full page*.

Japanese Journal of Applied Physics, vol. 28, No. 11, Nov. 1989, pp. 2211–2218, Tokyo, JP; S. Otsubo et al.: "Crystallization induced by laser irradiation in Ba–Y–CU–O superconducting films prepared by laser ablation" * p. 2211, par. 2–3; p. 2212, Fig. 1; p. 2213, par. 2–3; p. 2214, par. 6–7; p. 2215, par. 6; p. 2218, par. 2*.

(List continued on next page.)

Primary Examiner—Roy V. King
Attorney, Agent, or Firm—Wenderoth, Lind & Ponack

[57] ABSTRACT

There is disclosed a method for annealing oxide thin film superconductors having layered structures including at least Cu—O layers in which each oxide thin film superconductor is heated partially by a heating means and the heating portion is moved at a predetermined speed.

17 Claims, 4 Drawing Sheets

OTHER PUBLICATIONS

Hill et al, "Passivation of high Tc superconductor surfaces with $CaF_2$ and Bi,Al, and Si oxides", Appl. Phys. Lett. 53(17) Oct. 1988 p. 1657–1659.

Levinson et al, "Laser zone–melted Bi–Sr–Ca–Cu–O thick films" Appl. Phys. Lett. 55(16) Oct. 1989 pp. 1683–1685.

LaGraff et al, "Magnetic and Structural properties of $YBa_2Cu_3O_{7-x}Fe_y$ as prepared by a $NF_3$ gas anneal," Phys. Rev. B, vol. 39(1) Jan. 1989 pp. 347–355.

Tsuruoka et al, "Y–Ba–Cu–O film Growth by OMCVD using $N_2O$", Jpn. J. Appl. Phys. 28(10) Oct. 1989 L1800–1802.

Smith et al, "Silicon–on–insulator by graphoepitaxy and zone–melting recrystallization of patterned films," J. Cryst. Growth 63 (1983) pp. 527–546.

Miaoulis et al, "Zone–melting processing of thick high–Tc superconducting films", J. Of Physics D: Applied Physics v. 22 N. 6, Jun. 1989 pp. 864–867.

Givargizov et al, "Production of Superconducting Y–Ba–Cu–O films," Pisma Zh. Tekh. Fiz, (USSR) vol. 14, No. 7–8, Apr. 1988 pp. 677–679.

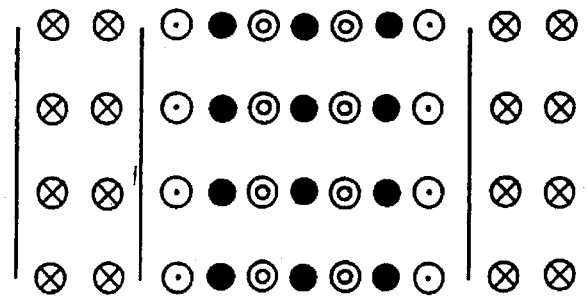
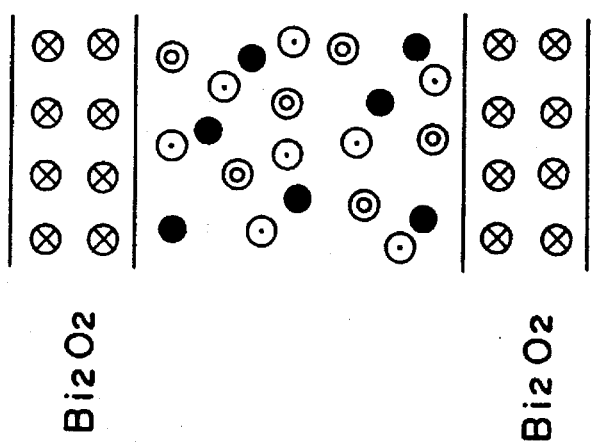

METHOD FOR ANNEALING THIN FILM SUPERCONDUCTORS

This application is a continuation of application Ser. No. 08/032,165, filed Mar. 12, 1993, which is a continuation of application Ser. No. 07/730,523, filed Jul. 12, 1991, which in turn is a continuation-in-part of application Ser. No. 07/507,117, filed Apr. 10, 1990, all said prior applications being now abandoned.

BACKGROUND OF THE INVENTION

1. Field of the Invention

The present invention relates to a method for annealing thin film superconductors made of an oxide having a layered structure including at least Cu—O layer.

2. Related Art

There have been known niobium nitride NbN and/or germanium niobium $Nb_3Ge$ being binary compounds of A 15 type as superconducting materials but their transition temperatures Tc are 24K at the most. Contrary to this, perovskite trivalent compounds are expected to have a higher transition temperature Tc and, in fact, there has been proposed a high temperature superconductor of Ba—La—Cu—O system (J. G. Bendorz and K. A. Muller, Zeitschrift fur physik B-Condensed Matter, 64, 189–193 (1986)).

Further, some of oxide superconductors are discovered to have critical temperatures higher than the temperature of liquid nitrogen (77.3K) and, therefore, contribute to widen the field of application of the superconductor. Especially, a Bi—Sr—Ca—Cu—O superconductor formed by a Bi complex oxide having a layered structure is found to have a transition temperature higher than 100K (H. Maeda, Y. Tanaka, M. Fukutomi and T. Asano, Japanese Journal of Applied Physics, 27, L209–210 (1988)).

Recently, it is reported that a Tl—Ba—Ca—Cu—O material makes a transition to a superconducting state at a temperature higher than 120K and is a complex compound having a layered structure similar to the Bi-superconductor (Z. Z. Sheng and A.M. Hermann, Letter to Nature, 332, 138–139 (1988)).

The mechanism for causing the superconductivity in materials of this type is not made clear in detail but there is a possibility that the transition temperature is made higher than a room temperature. Accordingly, the trivalent complex compounds of this type are expected to have much more excellent properties than those of the binary compounds mentioned above.

In order to obtain high temperature thin film superconductors having excellent superconducting properties, it is necessary to improve the crystal state of the thin film. According to the conventional method, the substrate on which a thin film is formed is heated up to a high temperature to obtain a regular crystal state. However, the annealing method by heating the substrate has a disadvantage in that crystal grains are grown thereby. These crystal grains make the surface of the thin film uneven and, thereby, it becomes impossible to make a super-fine work of an order of submicron on the thin film in order to form various superconducting devices.

In order to obtain even thin films, there is proposed a method in which a thin film is formed by growing a monocrystalline layer on a monocrystalline substrate kept at a low temperature. In this method, $SrTiO_3$ and MgO is used as a substrate. Further, $LaAlO_3$ and $LaGaO_3$ having small dielectric constants are noticed as substrates taking into consideration of future use of superconducting devices in super high frequency field. However, these substrates are very expensive and hard to obtain. Further, the film formation conditions for growing the monocrystal homogeneously on the substrate are restricted by the structure of the forming apparatus and it is difficult to obtain superconducting thin films of large areas with a good reproducibility.

Especially, Tl—Ba—Ca—Cu—O or Bi—Sr—Ca—Cu—O materials exhibiting the highest critical temperature at the present needs a high temperature process higher than 850° C. which causes the growth of grains. No method for forming thin films with a low temperature process is realized by the present and, therefore, no superconducting thin films having smooth flat surfaces have been obtained.

SUMMARY OF THE INVENTION

An essential object of the present invention is to provide a method for obtaining thin film superconductors with excellent properties.

In order to achieve the objects of the present invention, there is provided a method for annealing thin film superconductors made of an oxide having a layered structure including at least a Cu—O layer being characterized by heating the surface of each thin film superconductor partially to melt and by moving the portion to be heated partially at a predetermined speed whereby the crystal structure of the oxide thin film superconductor is improved.

It is desirable in the present invention to form a cover film on the oxide thin film superconductor. In this case, the oxide thin film superconductor is partially heated through the cover film and the flatness of the oxide thin film superconductor is maintained or guaranteed by the cover film.

This method makes formation of devices utilizing thin film superconductors easier.

It is to be noted that the thin film oxide superconductor having a layered structure necessitates oxygen upon crystal growth and, accordingly, it becomes possible to obtain thin film superconductors having an excellent crystal structure by this heating method using a container into which a gas including oxygen and/or nitrogen suboxide or nitrogen sulfide is introduced.

Further, as the heating means linear irradiation means by scanning laser beam or electron beam or linear heating using focused infrared rays, high frequency heating or strip heater is available. In this case, the linear heating means and the thin film oxide superconductor are moved relative to each other.

The material for the cover film is desirably selected among materials which are transparent to the infrared light and have a melting point higher than 1000° C.

As the materials which satisfy the above conditions, oxides, fluorides and perovskite oxides are available.

The present invention utilizes such a property that the crystal structure of heating and melting part is arranged to that of the peripheral solid state portion is kept as it is during the cooling process. Due to this effect, impurities are removed and the crystallization is promoted. Accordingly, it becomes possible to obtain single crystal thin films of large areas by optimizing the heating conditions.

According to one aspect of the present invention, there is formed a cover film on the thin film superconductor. This cover film prevents the generation of a roughness reflecting grain structure on the surface thereof which is generated in the usual thermal treatment and, thereby, guarantees to obtain thin films having flat surfaces.

In this case, the heating temperature is set so as for the cover film not to melt and the crystal growth is promoted during cooling of the heated and melted portion thereof. This enables the monocrystal growth over a wide area.

This method corresponds to the zone melting recrystallization method known as a recrystallization method. In the present invention, this method is applied to the oxide thin film having a layered crystal structure and, thereby, makes it possible to obtain layered oxide thin films having flat or even surfaces and excellent crystal structures.

In another aspect of the present invention, the oxide thin film superconductor is heated partially in a container into which a gas including nitrogen suboxide or nitrogen sulfide. This gas contributes to promote oxidization of metal elements compositting the oxide thin film superconductor and, thereby, the crystal structure is improved. Further, by moving the portion to be heated at a predetermined speed, the crystal growth in a transversal direction is promoted and, thereby, the increase of the critical current density and the flatness of the surface of the thin film are obtained since the grain size is expected to increase when compared with the conventional method.

BRIEF DESCRIPTION OF THE DRAWINGS

These and other objects and features of the present invention will become clear from the following description taken in conjunction with the preferred embodiment thereof with reference to the accompanying drawings, in which:

FIG. 5(a) is a schematic sectional view for showing a crystal structure of the oxide superconductive thin film before the annealing treatment, and FIG. 5(b) is a schematic sectional view for showing a crystal structure of the oxide superconductive thin film after the annealing treatment.

DETAILED DESCRIPTION OF THE PREFERRED EMBODIMENT

Y—Ba—Cu—O, Bi—Sr—Ca—Cu—O and Tl—Ba—Ca—Cu—O oxides having the layered structure are discovered as high Tc superconductors. These oxides are characterized in that they are crystals including Cu—O layers.

Figure 1:
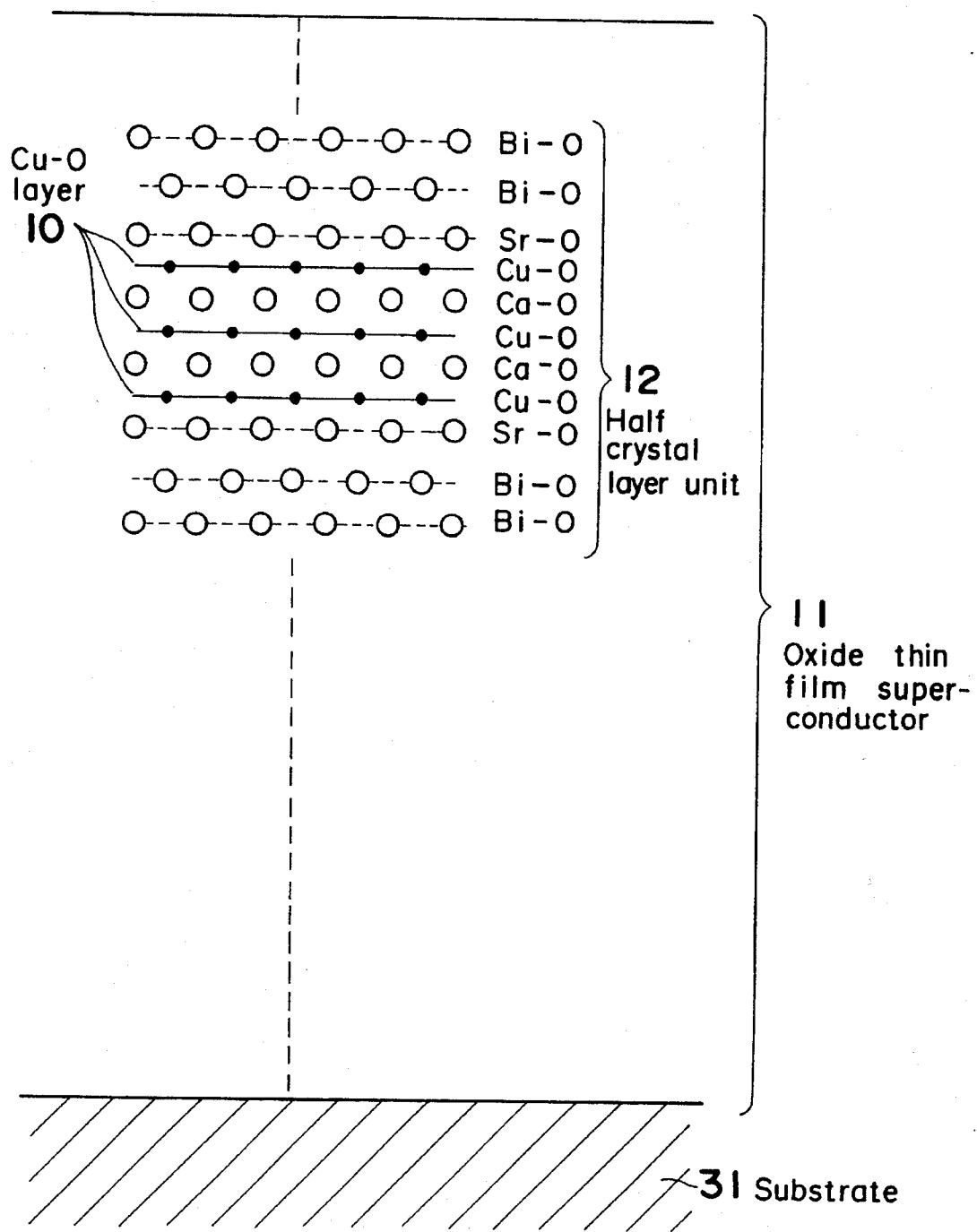
FIG. 1 is a schematic view showing a crystal structure of a layered oxide thin film superconductor including Cu—O layers.

FIG. 1 shows a schematic layered crystal structure of the thin film oxide superconductor 11 of $Bi_2Sr_2Ca_2Cu_3O_y$. The Cu—O layer is considered to contribute to the superconductivity to some extent but the role thereof is not fully studied for the present.

In the preferred embodiment, the Bi—Sr—Ca—Cu—O system is explained as an example.

Individual elements and/or compounds as evaporation sources which composite the superconductor are deposited alternatively on a substrate kept at a temperature lower than 800° C. in a gas including oxygen to stack them periodically on the substrate.

When deposition rates of respective evaporation sources are adjusted properly in the deposition process, it is discovered that a phase having a critical temperature Tc equal to or higher than 100K is generated corresponding to the period of stack of layers. It is discovered that an excellent crystal structure of the phase having a high Tc ($\geq 100K$) is obtained in the case that the temperature of the substrate is kept at a temperature ranging from 500° to 800° C. Thus, thin film oxide superconductors are obtained.

There are considered some methods for stacking individual elements and/or compounds constituting the superconductor periodically. In general, it can be attained to stack layers periodically by controlling shutters arranged in front of respective evaporation sources in MBE apparatus or EB deposition apparatus of multi-sources or switching the kind of gas in the gas phase growing method. The sputtering method using the plasma discharge or the laser beam also enables to form an excellent stack of layers. In this case, a high pressure of oxygen during the sputtering and the sputter discharge contribute advantageously to form the phase having a high Tc ($\geq 100K$) in the Bi complex oxide having a layered structure.

Figure 3:
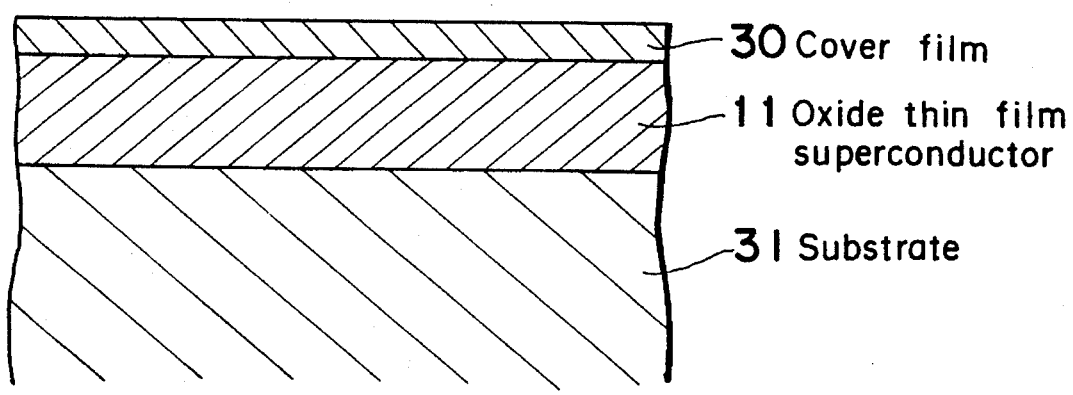
FIG. 3 is a schematic sectional view of the thin film superconductor according to the preferred embodiment of the present invention.

As shown in FIG. 3, a cover film 30 is formed on the thin film oxide superconductor 11 having been formed on the substrate 31. The sputtering method or EB deposition method being suitable for forming transparent insulating films is advantageously used for forming the cover film 30.

Figure 2:
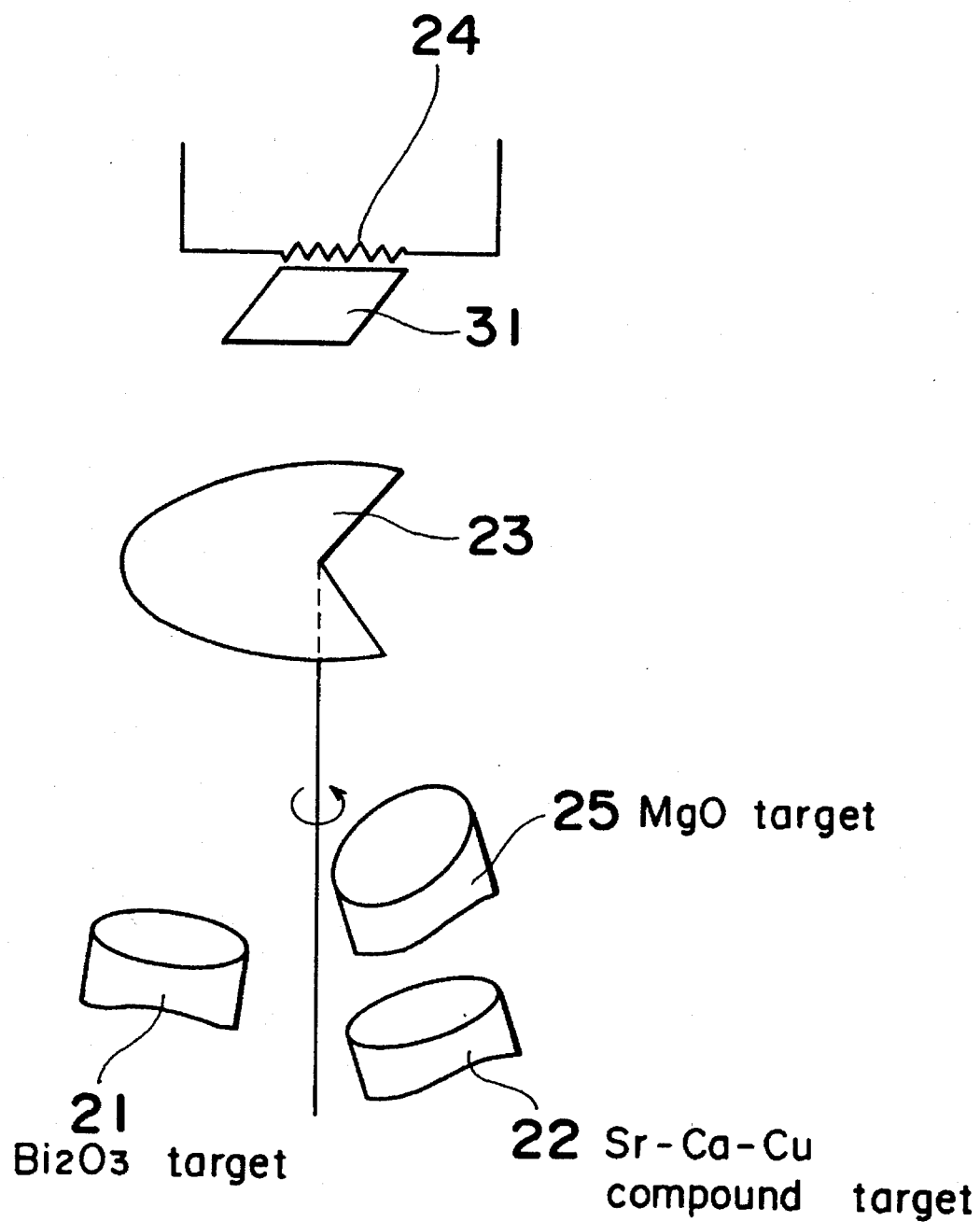
FIG. 2 is a schematic perspective view of an apparatus for producing thin films which is comprised of plural targets and a shutter.

Upon forming the thin film, an Si—Ca—Cu compound target 22 and a $Bi_2O_3$ target 21 are set in a vacuum apparatus, as shown in FIG. 2, and, at first, Ar and oxygen gasses are introduced therein to generate discharges and sputtering conditions are set. The formation of the thin film on the surface of the substrate 31 maintained at 700° C. by a heater 24 is started by depositing Bi IIa family and Cu thereon by sputtering the $Bi_2O_3$ target 21 and the Sr—Ca—Cu compound target 22. In this case, the Bi complex oxide thin film superconductor 11 having a layered structure is formed by setting the sputtering conditions suitably and controlling the shutter 23 so as to coincide the composition of the thin film with the stoichiometry ratio of Bi oxide superconductor. In other words, the Bi oxide superconductor is obtained by adjusting the rotation time of the shutter 23 and applying electric powers to respective targets.

After forming the oxide thin film superconductor 11 of the thickness of 500 Å according to the method mentioned above, the introduction of the oxygen gas is stopped and, then, a high frequency electric power is applied to a MgO target 25 set in the vacuum apparatus to sputter the target 25 in Ar gas atmosphere. Due to this sputtering process, the cover film 30 of the thickness of about 3000 Å is formed on the surface of the oxide thin film superconductor 11 having been formed. The cover film 30 is easily formed using the sputtering method. However, all other methods which enable to form homogeneous and uniform films are available. MgO, magnesia spinel, $ZrO_2$, YSZ, $SrTiO_3$ and the like are suitable for the cover film 30. Further, $CaF_2$, $BaF_2$, $SrF_2$, $BiF_3$, CaO, SrO, BaO, $BiO_3$, $Cu_2O$ and perovskite oxides such as $LaAlO_3$, $LaGaO_3$, $Bi_4Ti_3O_{12}$, $Bi_2Ti_4O_{11}$ and the like are available when taken the matching with the material forming the superconductor into consideration.

Figure 4:
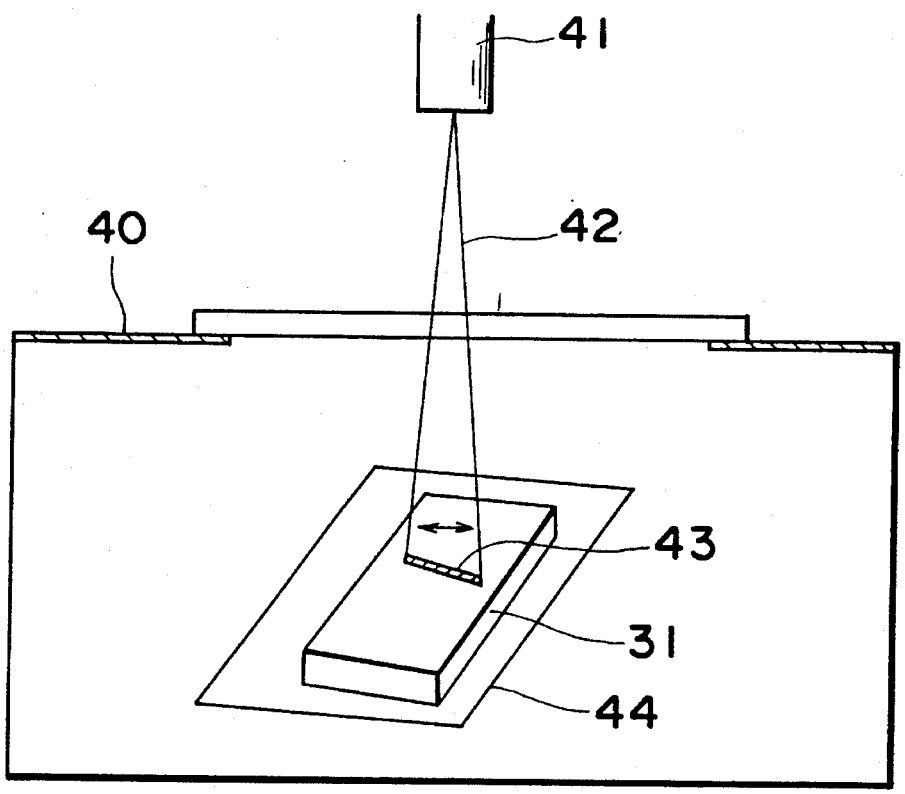
FIG. 4 is an explanatory view for showing the annealing method according to the preferred embodiment of the present invention.

As shown in FIG. 4, the substrate 31 with only the complex oxide thin film superconductor 11 or with the superconductor 11 and the cover film is set in an evacuated container 40 into which at least oxygen, nitrogen suboxide or nitrogen sulfide is introduced and is irradiated by scanning the surface thereof with a laser beam 42 emitted from a $CO_2$ laser 41 arranged outside the container. The substrate 31 is moved at a speed of 1 cm/min. in a direction perpendicular to the scan direction of the laser beam 42. In place of the laser, the scan by the electron beam or focusing infrared rays emitted from an infrared ray lamp linearly on the substrate is available for the annealing method. Further, high frequency heating or a strip heater is usable therefore. In the case of the heating by the electron beam, the substrate is set in the vacuum apparatus but the gas mentioned above is not to be introduced. The heating portion 43 of the complex oxide thin film superconductor 11 heated by the heating means is melted and, when the heating portion 43 is moved, the melted portion is cooled and is monocrystallized. Even if the heating portion is not melted completely, mismatches in the crystal structure caused during the formation of the layered complex oxide thin film superconductor, crystal defects which affect to the superconductive properties, lattice mismatches in the crystal grain boundary and impurities can be removed by heating individual heating portions and, therefore, the superconducting properties of the oxide thin film superconductor are improved.

It is desirable to set the substrate 31 on a plane heater 44 in order to heat it with a plane auxiliarily. This enables to reduce the electric power to be supplied to the heating source for the linear heating and makes the control thereof easier. Of course, the temperature of the plane heater 44 is set lower than the melting point of the layered complex oxide thin film superconductor. Thus, it becomes possible to improve the crystal structure of the thin film by annealing it according to the present invention.

As the result of an analysis of the crystal structure of the thin film using the X-ray diffraction method, it is confirmed that the crystal phase of the Bi layered complex oxide can be controlled by adjusting the moving speed and the heating energy of the linear heating portion, and/or the temperature of the plane heater.

The crystal structure is improved by the heating treatment mentioned above and, in the case that the surface of the oxide superconductor is covered by the cover film, the flatness of the surface thereof is maintained by the cover film.

It becomes necessary to remove the cover film in order to form devices using the oxide thin film superconductor obtained. In order for that, the ion milling method can be advantageously used.

According to this method, Ar gas is introduced into the vacuum container and ionized. Ar ions are accelerated to collide to the cover film and, thereby, it is sputtered off. The inventors of the present invention confirmed that the flat surface is maintained by this method.

FIG. 5(a) shows a schematic crystal structure of Bi—Si—Ca—Cu—O oxide thin film superconductor formed by the sputtering and FIG. 5(b) shows a schematic crystal structure of the same after annealing by irradiating a laser beam according to the present invention.

As shown in FIG. 5(a), Sr—O, Ca—O and Cu—O are mixed with each other in the oxide thin film superconductor formed by the sputtering. By the annealing treatment, they are rearranged to form a regular layered structure, as shown in FIG. 5(b).

Conventionally, it is known that the thin film superconductor having such a regular layered structure as shown in FIG. 5(b) can be obtained by annealing the same using oxygen gas at a temperature in a range 850° to 900° C. As far as the critical temperature is concerned, there is no difference between the conventional annealing method and the present invention. But, the inventors of the present invention discovered that the density of the critical current is increased according to the present invention when compared with the conventional annealing method.

It is to be noted that the same result is obtained by replacing oxygen gas with $N_2O$ completely. The inventors of the present invention discovered that an excellent layered crystal structure of Bi—Sr—Ca—Cu—O oxide thin film superconductor could be obtained at an annealing temperature in a range 600° to 800° C. lower than that needed in the annealing without $N_2O$ when $N_2O$ was added. Though the mechanism of this effect is not understood fully, it is considered that $N_2O$ is thermally dissociated at a relatively low temperature of about 400° C. and excited oxide radicals generated upon the thermal dissociation promote crystallization and oxidization of metal elements to grow crystal grains enoughly.

Further, the same results as the case of $N_2O$ gas was obtained by subjecting the annealing treatment by adding nitrogen sulfide ($N_2S$) to oxygen gas. It was confirmed by the inventors of the present invention that the Bi—Sr—Ca—Cu—O oxide superconductor thin film having an excellent layered structure could be obtained when the pressure ratio of $N_2S$ to $O_2$ was kept within a range 0.05 to 1.00.

The inventors of the present invention also confirmed that the present invention was especially effective for oxide superconductors having layered structures including Cu—O layers since they had layered structures and crystals were apt to grow in a transversal direction, namely in a direction parallel to the base plane of the substrate.

According to the present invention, thin films on a substrate of large size can be produced with a good reproducibility in high Tc superconductive materials represented by the Bi—Sr—Ca—Cu—O oxide superconductor. Therefore, it becomes possible to make super fine works of a submicron order. This makes the formation of various superconductive devices easier and, accordingly, the present invention is valuable for the industrial use.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A method for annealing a thin film superconductor to improve the crystallinity thereof, said thin film superconductor having a plurality of layered crystalline structures formed on a heated substrate, each layered crystalline structure being formed by depositing a plurality of metal oxides, including Cu—O, on said substrate, which annealing method comprises the steps of:

1) heating the thin film superconductor partially with a heating means so as to at least partially zone melt a portion of the Cu—O-containing layered metal oxide crystalline structure, and 2) moving the partially heated thin film superconductor away from the heating means at a speed sufficient to cool and recrystallize the partially melted portion thereof, thereby improving the crystallinity of said thin film superconductor.

2. A method according to claim 1 in which the thin film superconductor is selected from the group consisting of Y—Ba—Cu—O, Bi—Sr—Ca—Cu—O and Tl—Ba—Ca—Cu—O having a layered structure.

3. A method according to claim 1 wherein the thin film superconductor is a Y—Ba—Cu—O layered structure.

4. A method according to claim 1 in which the thin film superconductor is a Tl—Ba—Ca—Cu—O layered structure.

5. A method according to claim 1 in which the thin film superconductor is a Bi—Sr—Ca—Cu oxide layered structure.

6. A method according to claim 5 in which thin film superconductor is a $Bi_2Sr_2Ca_2Cu_3$ oxide layered structure.

7. A method according to claim 1 in which said annealing is carried out in an oxygen gas-containing atmosphere at a temperature range of 850°–900° C.

8. A method according to claim 1 in which said annealing is carried out in an $N_2O$ atmosphere at a temperature range of 600° to 800° C.

9. A method according to claim 1 in which said annealing is carried out in an $N_2S$—$O_2$ gas containing atmosphere in which the pressure ratio of $N_2S$ to $O_2$ is maintained within a range of 0.05 to 1.00.

10. A method according to claim 1, wherein a substantially single crystal thin film superconductor is formed by the annealing steps.

11. A method as claimed in claim 1 further comprising forming a cover film on said thin film superconductor through which it is heated partially.

12. A method as claimed in claim 1 or 11 in which the partial heating of said thin film superconductor is done in a container into which a gas including oxygen or nitrogen suboxide is introduced.

13. A method as claimed in either of claims 1 or 11 in which the partial heating of said thin film superconductor is carried out by a linear irradiation using a laser beam or an electron beam scan or a linear heating using focused infrared rays, a high frequency heating or a strip heater and the linear heating portion is moved relative to said thin film superconductor.

14. A method as claimed in claim 11, in which said cover film is made of at least one material selected from the group consisting of perovskite oxides, magnesium oxide, magnesia spinel, calcium fluoride, barium fluoride, strontium fluoride, bismas fluoride, calcium oxide, strontium oxide, barium oxide, bismas oxide and copper oxide.

15. A method as claimed in claim 13, in which the partial heating of said thin film superconductor is carried out while heating the substrate by a plane heating means.

16. Method as claimed in claim 12 in which the partial heating of said thin film superconductor is carried out by a linear irradiation using a laser beam or electron beam scan or a linear heating using focused infrared rays, a high frequency heating or a strip heater and the linear heating portion is moved relative to said thin film superconductor.

17. A method according to claim 11 in which the cover film is transparent to infrared light and has a melting point higher than 1000° C.

* * * * *

UNITED STATES PATENT AND TRADEMARK OFFICE
CERTIFICATE OF CORRECTION

PATENT NO. : 5,527,767
DATED : June 18, 1996
INVENTOR(S) : Kentaro Setsune, et. al.

It is certified that error appears in the above-indentified patent and that said Letters Patent is hereby corrected as shown below:

Title page, under item [63] after "Continuation of Ser. No. 32,165," change "Mar. 19" to --Mar. 12--; and after "which is a continuation in-part of Ser. No. 507,117." change "Apr. 19" to --Apr. 10--.

Signed and Sealed this

Twenty-fourth Day of September, 1996

Attest:

BRUCE LEHMAN

*Attesting Officer*  *Commissioner of Patents and Trademarks*